(12) United States Patent
Shimura et al.

(10) Patent No.: US 8,922,156 B2
(45) Date of Patent: Dec. 30, 2014

(54) SOLAR POWER-GENERATING EQUIPMENT

(75) Inventors: Jusuke Shimura, Kanagawa (JP);
Yoshiaki Inoue, Aichi (JP)

(73) Assignee: Sony Corporation, Tokyo (JP)

( * ) Notice: Subject to any disclaimer, the term of this patent is extended or adjusted under 35 U.S.C. 154(b) by 882 days.

(21) Appl. No.: 13/112,062

(22) Filed: May 20, 2011

(65) Prior Publication Data

US 2011/0291608 A1    Dec. 1, 2011

(30) Foreign Application Priority Data

May 28, 2010  (JP) ................................. 2010-122818
Mar. 11, 2011  (JP) ................................. 2011-053659

(51) Int. Cl.
*H02J 7/00* (2006.01)
*H01M 10/46* (2006.01)
*H01M 10/48* (2006.01)
*H01L 25/04* (2014.01)
*H01M 10/42* (2006.01)

(52) U.S. Cl.
CPC ............ *H01M 10/465* (2013.01); *H01M 10/48* (2013.01); *H01M 10/488* (2013.01); *H01L 25/047* (2013.01); *Y02B 10/14* (2013.01); *H01M 10/425* (2013.01); *H01M 2200/00* (2013.01); *H01M 2220/30* (2013.01)
USPC ......................................................... 320/101

(58) Field of Classification Search
CPC ................. H02J 7/35; H01M 10/465
See application file for complete search history.

(56) References Cited

U.S. PATENT DOCUMENTS

| | | | | |
|---|---|---|---|---|
| 5,196,781 | A * | 3/1993 | Jamieson et al. | 320/102 |
| 6,879,133 | B1 * | 4/2005 | Geren | 320/134 |
| 7,701,166 | B2 * | 4/2010 | Lin et al. | 320/101 |
| 8,629,646 | B2 * | 1/2014 | Bullen et al. | 320/101 |
| 2009/0007958 | A1 * | 1/2009 | Ho et al. | 136/245 |
| 2009/0273481 | A1 * | 11/2009 | Traywick et al. | 340/636.1 |
| 2010/0154887 | A1 * | 6/2010 | Bullen et al. | 136/259 |
| 2011/0199040 | A1 * | 8/2011 | English et al. | 320/101 |
| 2011/0204843 | A1 * | 8/2011 | Foster | 320/101 |
| 2011/0293970 | A1 * | 12/2011 | Shimura et al. | 429/7 |

FOREIGN PATENT DOCUMENTS

| | | |
|---|---|---|
| JP | 08-223817 | 8/1996 |
| JP | 2002-076420 A | 3/2002 |
| JP | 2006-024636 A | 1/2006 |
| WO | WO 2010/059237 A1 | 5/2010 |

* cited by examiner

*Primary Examiner* — Drew A Dunn
*Assistant Examiner* — Steve T Chung
(74) *Attorney, Agent, or Firm* — Wolf, Greenfield & Sacks, P.C.

(57) ABSTRACT

Disclosed herein is solar power-generating equipment, including: a solar cell; a secondary battery; an electric power outputting portion; a display portion configured to display thereon information about an electric-generating capacity of the solar cell, and information about a state of charge of the secondary battery; and a control portion configured to cause the display portion to display thereon the information about the electric-generating capacity of the solar cell only for a predetermined time length, and cause the display portion to display thereon the information about the state of charge of the secondary battery only for a predetermined time length.

16 Claims, 4 Drawing Sheets

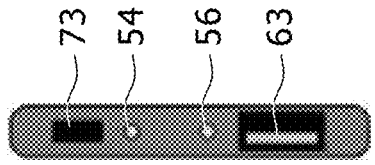
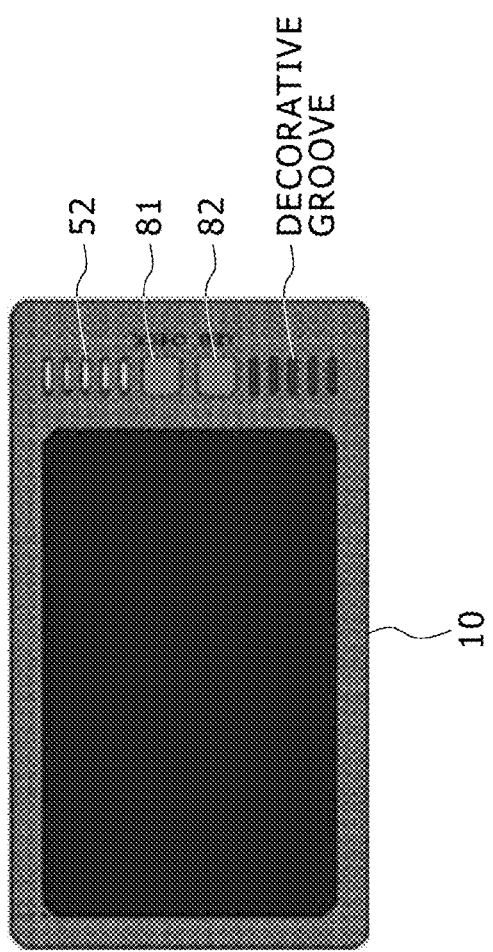

SOLAR POWER-GENERATING EQUIPMENT

BACKGROUND

The present disclosure relates to solar power-generating equipment.

For obtaining a more electric-generating capacity by using solar power-generating equipment, the solar power-generating equipment itself needs to be installed in a place where high illuminance is obtained. In addition, a solar cell panel needs to face up to a light source (for example, the sun) as much as possible. Installation type solar power-generating equipment for a house or the like is fixed in an azimuth direction (bearing) and an elevation angle in which an electric power can be efficiently generated, or such an automatic follower-up system as to usually face up to the sun is often mounted. However, in the case of portable small solar power-generating equipment, it is difficult to load the portable small solar power-generating equipment with the function such as the automatic follower-up system in many cases. Therefore, a user needs to usually select an installation place where an excellent efficiency is obtained, thereby adjusting the installation direction and the installation angle.

A lot of installation type solar power-generating equipment for the house or the like is connected to a transmission network on a steady basis, and normally, the generated electric power is caused to be reversely power-flowed to the transmission network. However, when the portable small solar power-generating equipment is connected to the transmission network on the steady basis, the portability is impaired. Therefore, the generated electric power is charged in a built-in battery (secondary battery) in many cases. Also, in the small solar power-generating equipment having such a battery built therein, unlike the installation type solar power-generating equipment for the house, when the built-in battery becomes a full charge state, it is unnecessary to generate the electric power any more.

Therefore, for enabling the work such as the selection of the installation place capable of obtaining the excellent power-generating efficiency from the solar power-generating equipment, and the adjustment of the installation direction and the installation angle to be readily carried out, thereby making the electric-generating capacity easy to be maximum, preferably, the solar power-generating equipment includes an electric-generating capacity informing section configured to inform a user of the present electric-generating capacity. In conjunction with this, preferably, the solar power-generating equipment includes a battery state-of-charge (SOC) informing section which can inform the user of information about whether or not the power generation is necessary at the present time, how much power generation time is required from now, whether or not the electric power needs to be generated any more, or the like.

SUMMARY

As described above, preferably, the solar power-generating equipment has both the electric-generating capacity informing section and the battery SOC informing section. However, when the portability is taken into consideration, it is difficult to provide a large display portion in the solar power-generating equipment, and thus these informing sections need to be simplified as much as possible. A method of using two or more light emitting elements such as light emitting diodes, and informing a user of a lot of information based on a combination of states of the two or more light emitting elements is reported as a method of simplifying the information section. This method, for example, is disclosed in Japanese Patent Laid-Open No. 2006-024636. However, when the light emitting diode is held either in an ON state or in a flashing state on a steady basis in accordance with the method disclosed in Japanese Patent Laid-Open No. 2006-024636, there is a disadvantage that the charged electric power of the built-in battery is rapidly consumed.

The present disclosure has been made in order to solve the problems described above, and it is therefore desirable to provide solar power-generating equipment which includes both an electric-generating capacity informing section and a battery SOC informing section and in which power consumption is suppressed as much as possible.

In order to attain the desire described above, according to an embodiment of the present disclosure, there is provided solar power-generating equipment (hybrid power source equipment) includes: a solar cell; a secondary battery; an electric power outputting portion; a display portion configured to display thereon information about an electric-generating capacity of the solar cell, and information about a state of charge (SOC) of the secondary battery; and a control portion configured to cause the display portion to display thereon the information about the electric-generating capacity of the solar cell only for a predetermined time length, and cause the display portion to display thereon the information about the state of charge of the secondary battery only for a predetermined time length.

As set forth hereinabove, according to the present disclosure, the solar power-generating equipment includes the control portion configured to cause the display portion to display thereon the information about the electric-generating capacity of the solar cell only for the predetermined time length, and also cause the display portion to display thereon the information about the state of charge of the secondary battery only for the predetermined time length. Therefore, although the solar power-generating equipment includes both an electric-generating capacity informing section and a state-of-charge informing section, the power consumption can be suppressed as much as possible.

BRIEF DESCRIPTION OF THE DRAWINGS

FIGS. 2A and 2B are a top plan view and a right side elevational view of the solar power-generating equipment according to the embodiment of the present disclosure, respectively;

DETAILED DESCRIPTION OF THE PREFERRED EMBODIMENTS

Figure 1:
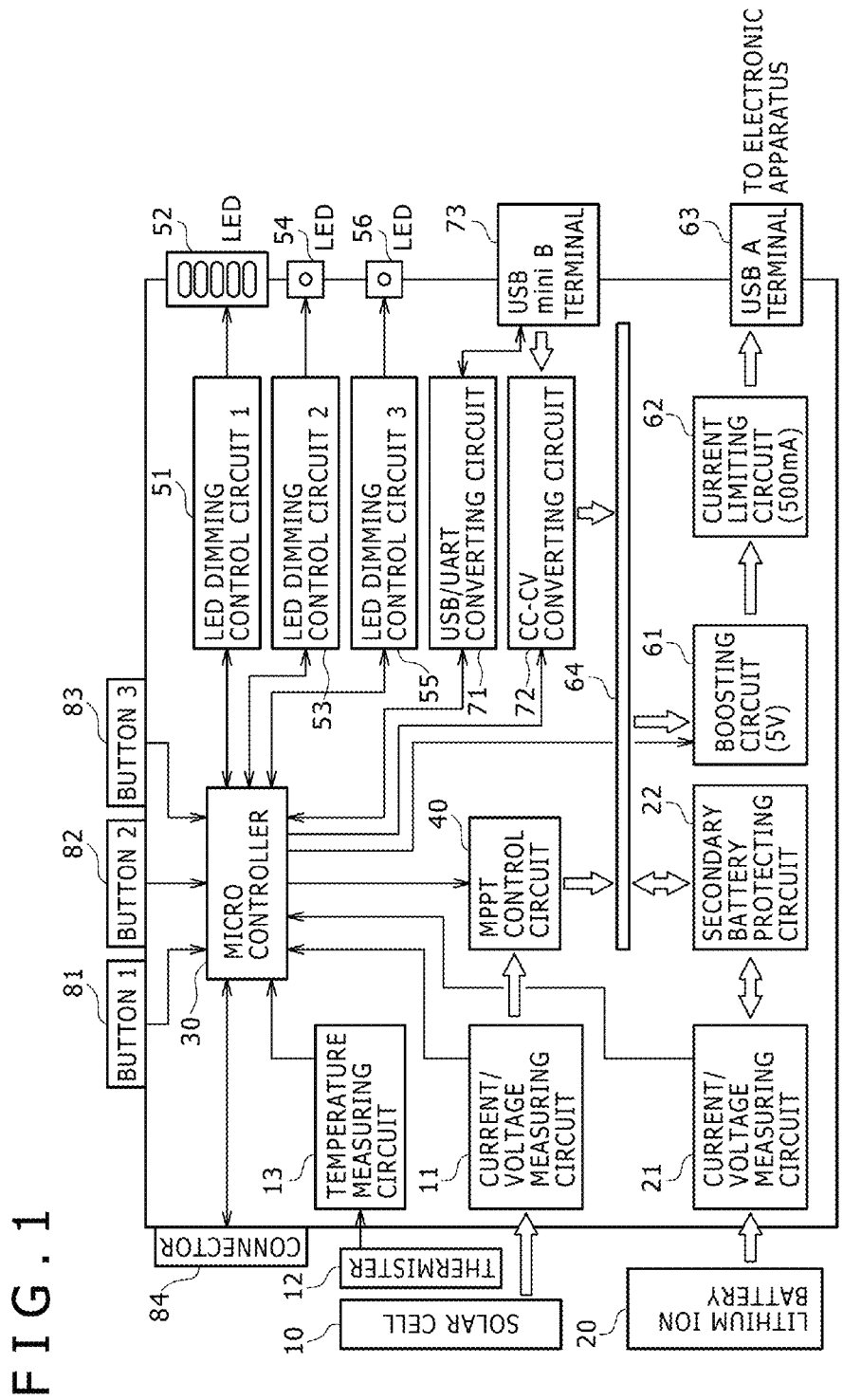
FIG. 1 is a conceptual block diagram of solar power-generating equipment according to an embodiment of the present disclosure.

Although the preferred embodiment of the present disclosure will be described in detail hereinafter with reference to the accompanying drawings, the present disclosure is by no means limited thereto, and also various numerical values and materials in the embodiment are merely exemplified. It is noted that the description will be given below in accordance with the following order.

1. Description about General Solar Power-Generating Equipment of the Disclosure
2. Embodiment (Solar Power-Generating Equipment of the Disclosure)
3. Change of Embodiment, and Others 1. Description about General Solar Power-Generating Equipment of the Disclosure In the solar power-generating equipment of one form of the present disclosure, a control portion includes an electric-generating capacity display starting section. By an operation of the electric-generating capacity display starting section, the control portion can display information about an electric-generating capacity on a display portion only for a predetermined time length. In addition, although not limited, it is possible to adopt a form such that the electric-generating capacity display starting section is composed of a push-button switch. Or, in the solar power-generating equipment of another form of the present disclosure, it is possible to adopt a form such that the control portion intermittently displays the information about the electric-generating capacity on the display portion only for a predetermined time length. Also, in the solar power-generating equipment of still another form of the present disclosure including the preferred forms described, it is possible to adopt a form such that (only) when the electric-generating capacity exceeds an amount of power consumption of the display portion, the control portion displays the information about the electric-generating capacity on the display portion only for a predetermined time length.

In addition, in the solar power-generating equipment of the embodiment of the present disclosure including the various preferred forms described above, it is possible to adopt such a configuration that the control portion includes a state-of-charge display starting section, and by an operation of the state-of-charge display starting section, the control portion displays information about a state of charge on a display portion only for a predetermined time length. In such a preferred configuration, the state-of-charge display starting section, although not limited, can have a configuration of being composed of a push-button switch.

In addition, in the solar power-generating equipment of the present disclosure including the various kinds of forms and configurations described above, it is possible to adopt a mode such that the display portion is composed of plural light emitting diodes. Also, in such a mode as described above, it is possible to adopt a mode such that an emission color of a light(s) emitted from the light emitting diode(s) composing the display portion for displaying thereon the information about the electric-generating capacity is different from an emission color of a light(s) emitted from the light emitting diode(s) composing the display portion for displaying thereon the information about the state of charge. In addition, it is possible to adopt a mode such that the display portion for displaying thereon the information about the electric-generating capacity, and the display portion for displaying thereon the information about the state of charge are composed of plural light emitting diodes common to them.

In addition, in the solar power-generating equipment of the present disclosure including the various preferred forms, configurations and modes described above, it is possible to adopt a configuration of further including an electric power output starting section configured to control output of the electric power from the electric power outputting portion to the outside. Moreover, it is possible to adopt such a configuration that the electric power output starting section serves as an electric power output pausing section as well configured to pause the output of the electric power from the electric power outputting portion to the outside. In these cases, it is possible to adopt such a configuration that the electric power output starting section is composed of a push-button switch. Also, in the solar power-generating equipment of the present disclosure including the various preferred forms, configurations and modes described above, it is possible to adopt such a configuration that the electric power outputting portion is composed of a Universal Serial Bus (USB). In addition, in the solar power-generating equipment of the present disclosure including the various preferred forms, configurations and modes described above, it is possible to adopt a configuration of further including a second universal serial bus terminal through which charge is specially carried out from the outside to the secondary battery.

In addition, in the solar power-generating equipment of the present disclosure including the various preferred forms, configurations and modes described above, it is possible to adopt a configuration of further including a secondary battery protecting circuit connected in parallel with the secondary battery.

Here, it is possible to adopt such a form that the secondary battery protecting circuit includes a first voltage detecting circuit, a second voltage detecting circuit, a switch section, and a heat radiating section; the first voltage detecting circuit connected in parallel with the secondary battery has a temperature detecting section; and when one of or both of the second voltage detecting circuit and the first voltage detecting circuit connected in parallel with the secondary battery are held in an ON state, the switch section becomes a conduction state and the electric power accumulated in the secondary battery is transformed into heat by the heat radiating section.

More specifically, in the secondary battery protecting circuit, the first voltage detecting circuit is composed of a first resistance voltage-dividing circuit connected in parallel with the secondary battery, having the temperature detecting section, and including a voltage outputting portion, and a first circuit whose input portion is connected to the voltage outputting portion of the first resistance voltage-dividing circuit, and which is turned ON when a voltage of the input portion is equal to or higher than a first reference voltage value.

In addition, the second voltage detecting circuit is composed of a second resistance voltage-dividing circuit connected in parallel with the secondary battery, and including a voltage outputting portion, and a second circuit whose input portion is connected to the voltage outputting portion of the second resistance voltage-dividing circuit, and which is turned ON when a voltage of the input portion is equal to or higher than a second reference voltage value.

Also, the switching section and the heat radiating section are connected in series with each other, and the switching section and the heat radiating section connected in series with each other are connected in parallel with the secondary battery, an operation of the switch section is controlled in accordance with an output from the first circuit and an output from the second circuit, and when one of or both of the first circuit and the second circuit are held in an ON state, the switch section becomes a conduction state and the electric power accumulated in the secondary battery is transformed into heat by the heat radiating section.

In such a secondary battery protecting circuit, the first voltage detecting circuit includes the temperature detecting section and the first circuit, the second voltage detecting circuit includes the second circuit, and when one of or both of the first circuit and the second circuit are held in an ON state, the switch section becomes a conduction state and the electric power accumulated in the secondary battery is transformed into heat by the heat radiating section to be abandoned as the heat. That is to say, the second voltage detecting circuit functions as a protecting circuit when a charge voltage value of the secondary battery exceeds either a safe full charge voltage value or a voltage value with which an overcharge state is caused. Also, the first voltage detecting circuit functions as a protecting circuit for reducing either a safe full charge voltage set value or a set voltage value with which the overcharge can be caused when a temperature of the secondary battery rises. As a result, it is possible to attain the high safety of the secondary battery.

In the secondary battery protecting circuit, as described above, it is possible to adopt such a form that either when an output voltage value in the voltage outputting portion of the first resistance voltage-dividing circuit becomes equal to or higher than the first reference voltage value $V_{REF-1}$ depending on the temperature detected by the temperature detecting section, or when an output voltage value in the voltage outputting portion of the second resistance voltage-dividing circuit becomes equal to or higher than the second reference voltage value $V_{REF-2}$, one of or both of the first circuit and the second circuit become the ON state. Note that, the first reference voltage value $V_{REF-1}$ is either an internal reference voltage value which the first circuit has or an output voltage value of a voltage reference IC. Also, the second reference voltage value $V_{REF-2}$ is either an internal reference voltage value which the second circuit has or the output voltage value of the voltage reference IC. It is only necessary that the first and second reference voltage values $V_{REF-1}$ and $V_{REF-2}$ are set as either voltage values each corresponding to a voltage value with which an overcharge state is prevented from being caused in the secondary battery at a reference temperature (for example, 40° C.), or voltage values each corresponding to the safe full charge voltage value of the secondary battery.

In the secondary battery protecting circuit including the preferred form described above, it is possible to adopt such a configuration that the temperature detecting section is preferably composed of a thermistor, and is more preferably composed of a thermistor having a negative temperature coefficient (that is, an NTC type thermistor whose electrical resistance value is reduced with a rise in temperature). In the secondary battery protecting circuit of the present disclosure including these preferred forms and configurations, it is possible to adopt such a configuration that the heating section is composed of a resistor. In addition, in the secondary battery protecting circuit of the present disclosure including these preferred forms and configurations, it is possible to adopt such a configuration that the switch section is composed of a transistor. Note that, when the switch section is composed of a Field Effect Transistor (FET), it is only necessary to input a logical sum of the output from the first circuit and the output from the second circuit to a gate terminal of the FET. On the other hand, when the switch section is composed of a bipolar transistor, it is only necessary to input the logical sum of the output from the first circuit and the output from the second circuit to a base terminal of the bipolar transistor. Either the first circuit or the second circuit, for example, can be composed of a shunt regulator, or can also be composed of a combination of an operational amplifier and a voltage reference IC, a combination of a comparator and a voltage reference IC, or a combination of a transistor and the voltage reference IC.

In the solar power-generating equipment of the present disclosure including the various preferred forms (hereinafter referred simply to as "the present disclosure" in some cases), configurations and modes described above, although a non-aqueous (nonaqueous electrolyte) secondary battery, specifically, a lithium ion battery having the well-known structure and construction can be given as the secondary battery, the present disclosure is by no means limited thereto, and a magnesium ion battery or an aluminum ion battery can also be given in addition thereto. In addition, a silicon system solar cell, or an organic system solar cell including a compound system solar cell, a dye-sensitized solar cell or an organic thin film solar cell can be given as the solar cell including a modularized solar cell. The solar power-generating equipment of the present disclosure, for example, can be incorporated in a car navigation system, various audio devices including portable type one, a mobile phone, various information terminals including a smart phone, a notebook type personal computer, a mobile type personal computer, a Personal Digital Assistant (PDA), a game machine, an electronic paper such as an electronic book or an electronic newspaper, an electronic calculator, a watch, or various home electric appliances. Or, the solar power-generating equipment of the present disclosure can be used as a power source of any of these electronic apparatuses.

Embodiment

An embodiment relates to solar power-generating equipment (hybrid power source equipment) of the present disclosure. FIG. 1 shows a conceptual block diagram of solar power-generating equipment of the embodiment. In addition, FIGS. 2A and 2B show a top plan view and a right side elevational view of the solar power-generating equipment of the embodiment, respectively. It is noted that a front surface, a left-hand side surface, a back surface, and a bottom surface of the solar power-generating equipment of the embodiment are flat surfaces, respectively, and nothing is provided thereon.

The solar power-generating equipment of the embodiment is the portable solar power-generating equipment (portable hybrid power source equipment), and includes:
  (a) a solar cell 10;
  (b) a secondary battery 20;
  (c) an electric power outputting portion 60;
  (d) a display portion configured to display thereon information about an electric-generating capacity of the solar cell 10, and information about a state of charge of the secondary battery 20; and
  (e) a control portion configured to cause the display portion to display thereon the information about the electric-generating capacity only for a predetermined time length, and also cause the display portion to display thereon the information about the state of charge of the secondary battery 20 only for a predetermined time length.

Here, the secondary battery 20 stores therein an electric power generated by the solar cell 10. In addition, the electric power outputting portion 60 including a universal serial bus outputs the electric power to the outside through the universal serial bus. The display portion is driven with the electric power generated in the solar cell 10. Also, the display portion is composed of a state-of-charge displaying portion 52 and an electric-generating capacity displaying portion 52. In addition, the control portion is composed of a state-of-charge display controlling circuit 30, 51 for displaying the information about the electric-generating capacity of the solar cell 10 on the electric-generating capacity displaying portion 52 only for the predetermined time length, and displaying the information about the state of charge of the secondary battery 20 on the state-of-charge displaying portion 52 only for the predetermined time length.

Although not limited, the solar cell 10 is composed of a dye-sensitized solar cell. In addition, the secondary battery 20 is composed of a nonaqueous (nonaqueous electrolyte) secondary battery, and specifically is composed of a lithium ion battery having a well-known structure and a well-known construction. A part of the electric power generated by the solar cell 10 passes through a well-known current/voltage measuring circuit 11 and a well-known MPPT control circuit 40 to be outputted to the outside through a power bus 64 and an electric power outputting portion 60. In addition, the rest (remainder) of the electric power generated by the solar cell 10 or the entire electric power when the part of the electric power generated in the solar cell 10 is not outputted to the outside is sent to the secondary battery 20 through the power bus 64, a well-known secondary battery protecting circuit 22 and a well-known current/voltage measuring circuit 21 to be charged in the secondary battery 20. In addition, the electric power stored in the secondary battery 20 is outputted to the outside through the current/voltage measuring circuit 21, the secondary battery protecting circuit 22, the power bus 64, and the electric power outputting portion 60. The electric power outputting portion 60 configured to output the electric power generated by the solar cell 10, and the electric power stored in the secondary battery 20 to the outside is composed of a well-known boosting circuit 61 for boosting a voltage up to 5 V, a well-known current limiting circuit 62 for limiting a value of a current to be outputted to 500 mA, and an A terminal 63 of a USB connector. In addition, a thermistor 12 is disposed in the vicinity of the solar cell 10 and is connected to a well-known temperature measuring circuit 13. When a temperature of the solar cell 10 detected by the thermistor 12 exceeds 40° C., the safe full charge voltage value is reduced. Specifically, for example, in the case where the safe full charge voltage value when the temperature of the solar cell 10 is 40° C. is 4.2 V, the safe full charge voltage value is reduced to 4.1 V when the temperature of the solar cell 10 is 50° C., and is reduced to 4.0 V when the temperature of the solar cell 10 is 60° C.

Operations of current/voltage measuring circuits 11 and 21, the temperature measuring circuit 13, the MPPT control circuit 40, and the boosting circuit 61 are all controlled by a microcontroller 30 composed of a well-known microcomputer. In addition, the microcontroller 30 is connected to a connector 84. Update or the like of firmware can be carried out through the connector 84. It is noted that the update of the firmware, an analysis of an operation of the solar power-generating equipment, and the like may be carried out through a second universal serial bus terminal 73 which will be described later.

The electric-generating capacity display controlling circuit 30, 51 is composed of the microcontroller 30 and a well-known LED dimming control circuit 51 connected to the microcontroller 30. The state-of-charge display controlling circuit 30, 51 is also composed of the microcontroller 30 and the LED dimming control circuit 51. Also, the control portion (electric-generating capacity display controlling circuit 30, 51) includes an electric-generating capacity display starting section. By an operation of the electric-generating capacity display starting section, the control portion (electric-generating capacity display controlling circuit 30, 51) display information about the electric-generating capacity of the solar cell 10 on the display portion (electric-generating capacity displaying portion 52) only for a predetermined time length (for example, only for four seconds). It is noted that specifically, the electric-generating capacity display starting section is composed of a push-button switch (illustrated as a button 1 in FIG. 1) 81 connected to the microcontroller 30. In addition, the control portion (state-of-charge display controlling circuit 30, 51) includes a state-of-charge display starting section. By an operation of the state-of-charge display starting section, the control portion (state-of-charge display controlling circuit 30, 51) displays information about a state of charge of the secondary battery 20 on the display portion (state-of-charge displaying portion 52) only for a predetermined time length (for example, only four seconds). It is noted that specifically, the state-of-charge display starting section is composed of a push-button switch (illustrated as a button 2 in FIG. 1) 82 connected to the microcontroller 30. It is noted that when the push-button switch 82 is depressed, the LED 54 is turned ON by the LED dimming control circuit 53 under the control made by the microcontroller 30. Here, the display portion (electric-generating capacity displaying portion 52 and the state-of-charge displaying portion 52) each connected to the LED dimming control circuit 51 are composed of plural light emitting diodes. Specifically, an emission color of a light emitted from the light emitting diode composing the display portion for displaying thereon information about an electric-generating capacity, and an emission color of a light emitted from the light emitting diode composing the display portion for displaying thereon the information about the state of charge are different from each other. More specifically, an emission color of a light emitted from the light emitting diode composing the electric-generating capacity displaying portion 52, and an emission color of a light emitted from the light emitting diode composing the state-of-charge displaying portion 52 are different from each other. The display portion for displaying thereon information about an electric-generating capacity (electric-generating capacity displaying portion 52) and the display portion for displaying thereon the information about the state of charge (state-of-charge displaying portion 52) are composed of plural light emitting diodes common thereto. The light emitting diodes emit the lights of different two colors (for example, a red color and a green color, and an orange color when the lights of the red color and the green color are emitted at the same time). Although the number of light emitting diodes is set as 10 (five sets) in total, the preset disclosure is by no means limited thereto. In addition, only when the electric-generating capacity of the solar cell 10 exceeds an amount of power consumption of the display portion (electric-generating capacity displaying portion 52), the control portion (electric-generating capacity display controlling circuit 30, 51) displays information about the electric-generating capacity of the solar cell 10 on the display portion (electric-generating capacity displaying portion 52) only for a predetermined time length. As a result, it is possible to further suppress the power consumption in the electric-generating capacity displaying portion 52.

It is noted that a system may also be adopted such that the control portion (electric-generating capacity display controlling circuit 30, 51) displays the information about the electric-generating capacity of the solar cell 10 intermittently (for example, every five seconds) on the display portion (electric-generating capacity displaying portion 52) only for a predetermined time length (for example, only for one second).

In addition, the solar power-generating equipment of the embodiment further includes an electric power output starting section configured to control output of the electric power from the electric power outputting portion 60 to the outside. Specifically, the electric power output starting section is composed of a push-button switch (illustrated as a button 3 in FIG.

1) 83 connected to the microcontroller 30. It is noted that a configuration may also be adopted such that the electric power output starting section serves as an electric power output pausing section as well configured to pause the output of the electric power from the electric power outputting portion to the outside. That is to say, when the push-button switch 83 is depressed, the output of the electric power from the electric power outputting portion to the outside is started under the control made by the microcontroller 30. When the push-button switch 83 is depressed again, the output of the electric power from the electric power outputting portion to the outside is paused under the control made by the microcontroller 30. It is noted that when the push-button switch 83 is depressed, the lighting of the LED 56 is controlled by the LED dimming control circuit 55 under the control made by the microcontroller 30. It is noted that when the voltage outputted from the secondary battery 20, for example, is equal to or higher than 3.7 V, the electric power (the voltage of 5 V, and the current of 500 mA) is supplied from the A terminal 63 of the USB connector to the outside in accordance with the operations of the boosting circuit 61 and the current limiting circuit 62.

In addition, the solar power-generating equipment of the embodiment further includes a second universal serial bus terminal through which the charge (rapid charge) is especially carried out from the outside to the secondary battery 20, specifically, a mini B terminal 73 of a USB connector. Data inputted to the mini B terminal 73 of the USB connector is sent to the microcontroller 30 through a well-known USB/UART converting circuit 71. On the other hand, the electric power sent from the outside is sent to the secondary battery 20 through the mini B terminal 73 of the USB connector, and a well-known CC-CV converting circuit 72 put under the control made by the microcontroller 30 and through the power bus 64, the secondary battery protecting circuit 22, and the current/voltage measuring circuit 21, thereby charging the secondary battery 20 with the electric power. It is noted that the charging of the secondary battery 20 with the electric power is carried out in accordance with a well-known Constant Current Constant Voltage (CCCV) charging system. For example, in a region in which the battery voltage V is equal to or lower than 4.1 V, the constant current charge using 300 mA is carried out. Also, when the battery voltage (internal electromotive force) of the secondary battery 20 rises through the charge, and thus the battery voltage becomes higher than 4.1 V, the operation is switched from the constant current control over to the constant voltage control. As a result, the charging current is gradually reduced and the battery voltage rises toward the output voltage (4.2 V). Also, the charge is completed when the charge current comes close to approximately zero. Since the charge of the secondary battery 20 from the outside can be carried out, the secondary battery 20 can be set in a full charge state at any time as may be necessary. It is noted that when the secondary battery 20 is set in the full charge state, the charge of the secondary battery 20 is automatically stopped under the control made by the microcontroller 30.

As shown in the top plan view of FIG. 2A, in the solar power-generating equipment of the embodiment, the solar cell 10 occupies a considerable portion of a central portion. The electric-generating capacity displaying portion and the state-of-charge displaying portion 52 composed of five sets of LEDs, the push-button switch 81, the push-button switch 82, and a decorative groove are disposed in the order from the upper side on the right-hand side. In addition, as shown in the right side elevational view of FIG. 2B, the second universal serial bus terminal 73, the LED 54, the LED 56, and the A terminal 63 of the USB connector are disposed in the order from the back surface side. Note that, in the solar power-generating equipment of the embodiment shown in FIGS. 2A and 2B, an illustration of the push-button switch 83 is omitted. Also, a configuration is adopted such that both the push-button switch 81 and the push-button switch 82 are depressed at the same time, thereby fulfilling the same function as that of the push-button switch 83, i.e., thereby carrying out the start of the output of the electric power from the electric power outputting portion 60 to the outside, and the pause of the output of the electric power from the electric power outputting portion 60 to the outside.

Hereinafter, a description will be given with respect to an operation of the solar power-generating equipment (hybrid power source equipment) of the embodiment.

When the solar cell 10 receives a light to generate an electric power, the microcontroller 30 carries out the charge control in accordance with either a hill-climbing system or an MPPT system, thereby charging the secondary battery 20. At this time, when a user depresses the push-button switch 81, the LED in the electric-generating capacity displaying portion 52 is turned ON in accordance with the electric-generating capacity of the solar cell 10 under the control made by the microcontroller 30. For example, a relationship between the electric-generating capacity, and the number of sets of LEDs turned ON is as described in Table 1. It is noted that although a relationship between the electric-generating capacity with which the orange color is visualized, and the number of sets of LEDs each turned ON is expressed in the form of a power of 2, the relationship between the electric-generating capacity and the number of sets of LEDs each turned ON is merely exemplified, and the present disclosure is by no means limited thereto.

TABLE 1

| | |
|---|---|
| In case of equal to or larger than 0.5 mW and smaller than 2 mW | 1 set |
| In case of equal to or larger than 2 mW and smaller than 8 mW | 2 sets |
| In case of equal to or larger than 8 mW and smaller than 32 mW | 3 sets |
| In case of equal to or larger than 32 mW and smaller than 128 mW | 4 sets |
| In case of equal to or larger than 128 mW | 5 sets |

As described above, the system may also be adopted such that the information about the electric-generating capacity of the solar cell 10 is automatically displayed intermittently on the electric-generating capacity displaying portion 52 only for the predetermined time length.

For displaying information about a charge remaining capacity in the secondary battery 20, the user depresses the push-button switch 82. Then, the LED in the electric-generating capacity displaying portion 52 is turned ON in accordance with the charge remaining capacity in the secondary battery 20 under the control made by the microcontroller 30. For example, a relationship between the electric-generating capacity and the number of LEDs each emitting a green light is as described in Table 2. However, the relationship between the charge remaining capacity and the number of LEDs each emitting a green light is merely exemplified, and thus the present disclosure is by no means limited thereto.

TABLE 2

| | |
|---|---|
| Smaller than 20% | 1 |
| Equal to or larger than 20% and smaller than 40% | 2 |
| Equal to or larger than 40% and smaller than 60% | 3 |
| Equal to or larger than 60% and smaller than 80% | 4 |
| Equal to or larger than 80% | 5 |

The solar power-generating equipment of the embodiment includes the electric-generating capacity display controlling circuit 30, 51 and the state-of-charge display controlling circuit 30, 51. In this case, the electric-generating capacity display controlling circuit 30, 51 displays the information about the electric-generating capacity of the solar cell 10 on the electric-generating capacity displaying portion 52 only for the predetermined time length. Also, the state-of-charge display controlling circuit 30, 51 displays the information about the state of charge of the secondary battery 20 on the state-of-charge displaying portion 52 only for the predetermined time length. Therefore, although the solar power-generating equipment of the embodiment includes both the electric-generating capacity informing section and the state-of-charge informing section, the power consumption can be suppressed as much as possible.

Change of Embodiment

Figure 3:
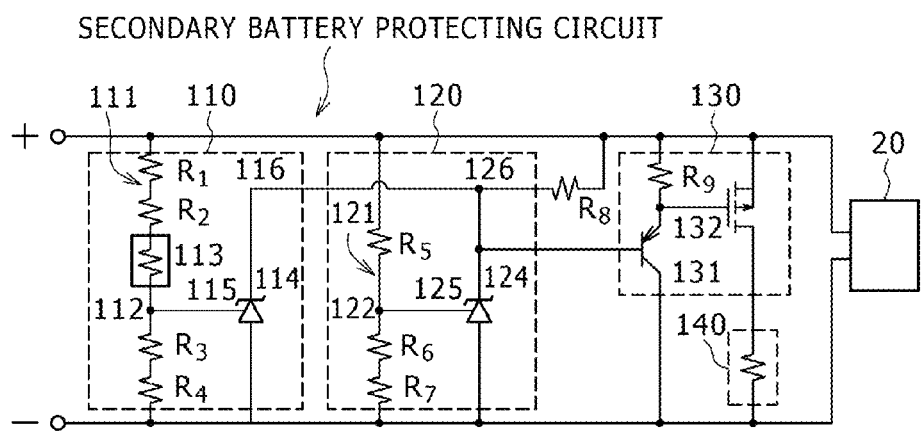
FIG. 3 is a circuit diagram of a secondary battery protecting circuit in a change of the embodiment of the present disclosure.

A change of the embodiment relates to an improvement in the secondary battery protecting circuit. FIG. 3 shows a circuit diagram of the secondary battery protecting circuit in the change of the embodiment. It is noted that in FIG. 3, an illustration of the current/voltage measuring circuit 21 and the MPPT control circuit 40 both shown in FIG. 1 is omitted here for the sake of simplicity. In addition, the solar power-generating equipment in the change of the embodiment has the same configuration and structure as those in the solar power-generating equipment of the embodiment except for the secondary battery protecting circuit.

The secondary battery protecting circuit in the change of the embodiment includes:

(A) a first voltage detecting circuit 110;
(B) a second voltage detecting circuit 120;
(C) a switch section 130; and
(D) a heat radiating section 140.

The first voltage detecting circuit 110 is composed of a first resistance voltage-dividing circuit 111 connected in parallel with the secondary battery 20, and a first circuit (specifically, a first shunt regulator 114). The first resistance voltage-dividing circuit 111 includes a temperature detecting section 113 and a voltage outputting portion 112. An input portion 115 of the first shunt regulator (first circuit) 114 is connected to the voltage outputting portion 112 of the first resistance voltage-dividing circuit 111. When a voltage at the input portion 115 is equal to or higher than a first reference voltage value $V_{REF-1}$, the first shunt regulator 114 is turned ON. The temperature detecting section 113 is composed of a thermistor, more specifically, an NTC type thermistor having a negative temperature coefficient. The first resistance voltage-dividing circuit 111, although not limited, is composed of four resistors $R_1$, $R_2$, $R_3$, and $R_4$ connected in series. The voltage outputting portion 112 is provided between the resistor $R_2$ and the resistor $R_3$. For example, in the resistor $R_1$ and the resistor $R_2$, one resistor has an electrical resistance value which is about two orders of magnitude larger than that of the other resistor. In the resistor $R_3$ and the resistor $R_4$ as well, one resistor has an electrical resistance value which is about two orders of magnitude larger than that of the other resistor. Thus, the electrical resistance values of these resistors $R_1$, $R_2$, $R_3$, and $R_4$ are adjusted, whereby it is possible to carry out a fine adjustment for a voltage value outputted from the voltage outputting portion 112.

The second voltage detecting circuit 120 is composed of a second resistance voltage-dividing circuit 121 connected in parallel with the secondary battery 20, and a second circuit (specifically, a second shunt regulator 124). The second resistance voltage-dividing circuit 121 includes a voltage outputting portion 122. An input portion 125 of the second shunt regulator (second circuit) 124 is connected to the voltage outputting portion 122 of the second resistance voltage-dividing circuit 121. When a voltage at the input portion 125 is equal to or higher than a second reference voltage value $V_{REF-2}$, the second shunt regulator 124 is turned ON. The second resistance voltage-dividing circuit 121, although not limited, is composed of three resistors $R_5$, $R_6$ and $R_7$ connected in series. The voltage outputting portion 122 is provided between the resistor $R_5$ and the resistor $R_6$. In the resistor $R_6$ and the resistor $R_7$, one resistor has a larger electrical resistance value than that of the other resistor. The electrical resistance values of three resistors $R_6$, $R_6$ and $R_7$ are adjusted, whereby it is possible to carry out a fine adjustment for a voltage value outputted from the voltage outputting portion 122.

The switch section 130 and the heat radiating section 140 are connected in series with each other, and the switch section 130 and the heat radiating section 140 connected in series are connected in parallel with the secondary battery 20. The heat radiating section 140 is composed of a resistor (for example, specification: 22Ω and 0.9 W). The switch section 130 is composed of a PNP transistor 131 and an FET (P-channel MOSFET) 132. Each of the output portion 116 of the first shunt regulator 114, and the output portion 126 of the second shunt regulator 124 is connected to a base terminal of the PNP transistor 131, and is also connected to one terminal of the secondary battery 20 through a resistor $R_8$. An emitter terminal of the PNP transistor 131 is connected to the one terminal of the secondary battery 20 through a resistor $R_9$, and is also connected to a gate terminal of the P-channel MOSFET 132. On the other hand, a collector terminal of the PNP transistor 131 is connected to the other terminal of the secondary battery 20. One source/drain region of the P-channel MOSFET 132 is connected to the one terminal of the secondary battery 20, and the other source/drain region of the P-channel MOSFET 132 is connected to one terminal of the heat radiating section 140. The other terminal of the heat radiating section 140 is connected to the other terminal of the secondary battery 20.

Also, the operation of the switch section 130 is controlled in accordance with the output from the first shunt regulator 114, and the output from the second shunt regulator 124. When one of or both of the first shunt regulator (first circuit) 114 and the second shunt regulator (second circuit) 124 are held in an ON state, the switch section 130 is kept in a conduction state. Thus, the electric power accumulated in the secondary battery 20 is transformed into the heat by the heat radiating section 140 to be abandoned as the heat.

More specifically, when an output voltage value $V_{out-1}$ from the voltage outputting portion 112 of the first resistance voltage-dividing circuit 111 becomes equal to or higher than the first reference voltage value $V_{REF-1}$ (for example, 1.24 V) depending on the temperature detected by the temperature detecting section (NTC type thermistor) 113, that is, depending on a change in electrical resistance value of the temperature detecting section 113, or when an output voltage value $V_{out-2}$ from the voltage outputting portion 122 of the second resistance voltage-dividing circuit 121 becomes equal to or higher than the second reference voltage value $V_{REF-2}$ (for example, 1.24 V), one of or both of the first shunt regulator 114 and the second shunt regulator 124 are turned ON. In other words, the first shunt regulator 114 and the second shunt regulator 124 configure a kind of "OR" circuit.

Figure 4:
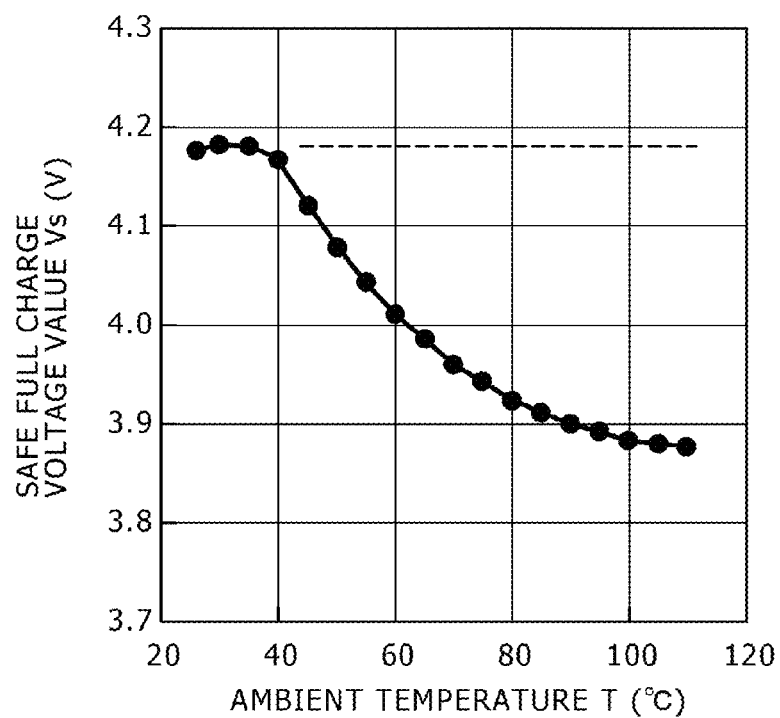
FIG. 4 is a graph representing a relationship between an ambient temperature and a safe full charge voltage value.

A relationship between an ambient temperature T and a safe full charge voltage value $V_s$ of the secondary battery 20 is exemplified in FIG. 4. When the ambient temperature T is equal to or lower than 40° C., the safe full charge voltage value $V_s$ is 4.18 V. However, when the ambient temperature T rises up to 60° C., the safe full charge voltage value V, is reduced to 4.01 V. When the ambient temperature T rises up to 80° C., the safe full charge voltage value V, is reduced to 3.93 V. Also, when the ambient temperature T rises up to 100° C., the safe full charge voltage value V, is reduced to 3.88 V.

The second reference voltage value $V_{REF-2}$ is an internal reference voltage value which the second shunt regulator 124 has. It is only necessary to set the second reference voltage value $V_{REF-2}$ either as a voltage value corresponding to a voltage value with which an overcharge state is not caused in the secondary battery 20 at a reference temperature (for example, 40° C.) or as a voltage value corresponding to the safe full charge voltage value of the secondary battery 20. Specifically, the second reference voltage value $V_{REF-2}$, for example, has to be made to agree with the output voltage value $V_{out-2}$ from the voltage outputting portion 122 of the second resistance voltage-dividing circuit 121 when a charge voltage value (that is, a voltage value inputted (applied) to the second resistance voltage-dividing circuit 121) $V_{in}$ is 4.18 V. Or, the electrical resistance values of the resistors $R_6$, $R_6$ and $R_7$ have to be adjusted so that when the charge voltage value $V_{in}$ of the secondary battery 20 is 4.18 V, the output voltage value $V_{out-2}$ from the voltage outputting portion 122 of the second resistance voltage-dividing circuit 121 agrees with the second reference voltage value $V_{REF-2}$.

The first reference voltage value $V_{REF-1}$ is an internal reference voltage value which the first shunt regulator 114 has. Similarly to the case of the second reference voltage value $V_{REF-2}$, it is only necessary to set the first reference voltage value $V_{REF-1}$ either as a voltage value corresponding to a voltage value with which an overcharge state is not caused in the secondary battery 20 at the reference temperature (for example, 40° C.) or as a voltage value corresponding to the safe full charge voltage value of the secondary battery 20. As described above, the safe full charge voltage value of the secondary battery 20 has such a negative temperature dependency that the safe full charge voltage value is reduced with a rise of the ambient temperature. On the other hand, the temperature detecting section (NTC type thermistor) 43 also has such a negative temperature dependency that the electrical resistance value thereof is reduced with a rise of the temperature. Therefore, for example, since the safe full charge voltage value is reduced to 4.01 V when the ambient temperature becomes 60° C., it is only necessary to select the temperature detecting section 113 having such characteristics that when the charge voltage value (that is, the voltage value inputted (applied) to the first resistance voltage-dividing circuit 111) $V_{in}$ of the secondary battery 20 is 4.01 V, the output voltage value $V_{out-1}$ from the voltage outputting portion 112 of the first resistance voltage-dividing circuit 111 becomes equal to the first reference voltage value $V_{REF-1}$. Or, it is only necessary to adjust the electrical resistance values of the resistors $R_1$, $R_2$, $R_3$, and $R_4$ so that when the charge voltage value $V_{in}$ of the secondary battery 20 is 4.01 V, the output voltage value $V_{out-1}$ from the voltage outputting portion 112 of the first resistance voltage-dividing circuit 111 agrees with the first reference voltage value $V_{REF-1}$. In general, if the safe full charge voltage value when the ambient temperature is 1° C. is taken to be $T_{s-T}$, it is only necessary to select the temperature detecting section 113 having such characteristics that when the charge voltage value $V_{in}$ of the secondary battery 20 is equal to the safe full charge voltage value $V_{s-T}$, the output voltage value $V_{out-1}$ from the voltage outputting portion 112 of the first resistance voltage-dividing circuit 111 becomes equal to the first reference voltage value $V_{REF-1}$. Or, it is only necessary to adjust the electrical resistance values of the resistors $R_1$, $R_2$, $R_3$, and $R_4$ so that when the charge voltage value $V_{in}$ of the secondary battery 20 is equal to the safe full charge voltage value $R_{s-T}$, the output voltage value $V_{out-1}$ from the voltage outputting portion 112 of the first resistance voltage-dividing circuit 111 becomes equal to the first reference voltage value $V_{REF-1}$. Or, it is only necessary to carry out the selection of the temperature detecting section 113, and the adjustment of the electrical resistance values of the $R_1$, $R_2$, $R_3$, and $R_4$ in combination with each other.

Figure 5:
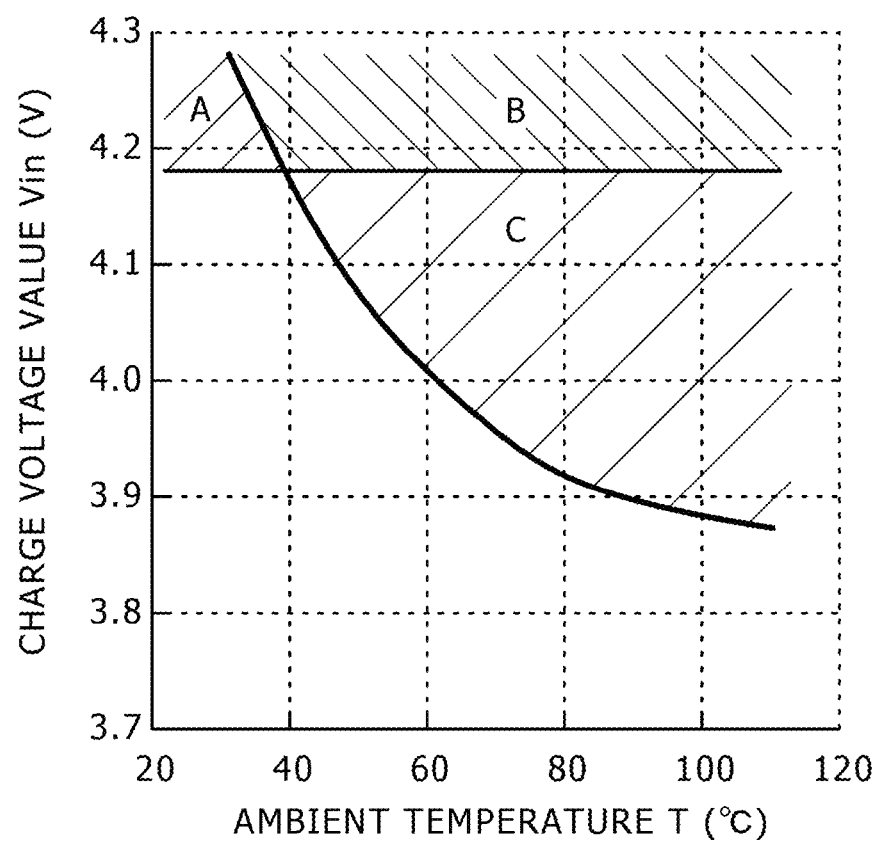
FIG. 5 is a graph representing a relationship between the ambient temperature and a charge voltage value in which a region in which one of or both of a first circuit and a second circuit are held in an ON state (conduction state) is schematically indicated by slant lines.

FIG. 5 schematically shows a relationship between the ambient temperature T and the charge voltage value $V_{in}$. In FIG. 5, when the charge voltage value $V_{in}$ of the secondary battery 20 exists in any of regions "A," "B" and "C," one of or both of the first shunt regulator 114 and the second shunt regulator 124 are held in the ON state. As a result, the electric power accumulated in the secondary battery 20 is transformed into the heat by the heat radiating section 140 to be abandoned as the heat.

The secondary battery protecting circuit of the change of the embodiment is connected in parallel with the nonaqueous secondary battery in such a manner and includes the first voltage detecting circuit, the second voltage detecting circuit, the switch section, and the heat radiating section. The first voltage detecting circuit connected in parallel with the secondary battery has the temperature detecting section. Also, when one of or both of the second voltage detecting circuit and the first voltage detecting circuit connected in parallel with the secondary battery are held in the ON state, the switch section is kept in the conduction state. As a result, the electric power accumulated in the secondary battery is transformed into the heat by the heat radiating section. That is to say, in the secondary battery protecting circuit of the change of the embodiment, or in the secondary battery protecting circuit included in the hybrid power source equipment, the second voltage detecting circuit functions as the protecting circuit when the charge voltage value of the secondary battery exceeds the safe full charge voltage value. Also, the first voltage detecting circuit functions the protecting circuit for reducing the safe full charge voltage set value when the temperature of the secondary battery rises. Therefore, it is possible to ensure the high safety of the secondary battery. In addition thereto, since the secondary battery protecting circuit monitors the charge voltage value of the secondary battery on a steady basis, the secondary battery protecting circuit operates as soon as the charge voltage value of the secondary battery exceeds the safe full charge voltage value a little. For this reason, it is possible to ensure the higher safety and also the secondary battery protecting circuit has the less power consumption. Moreover, the resistor having the small electrical resistance value can be used as the heat radiating section.

Although the present disclosure has been described so far based on the preferred embodiment, the present disclosure is by no means limited thereto. The configuration and structure of the solar power-generating equipment (hybrid power source equipment), the secondary battery, the solar cell, and the secondary battery protecting circuit which have been described in the embodiment and the change of the embodiment are merely exemplified, and thus can be suitably changed. For example, the error display and the display of the diagnosis of the operation of the solar power-generating equipment, and the results of the diagnosis can be carried out based on short and long of the period of time for depressing of the push-button switch, and the number of times of the depressing operation, or a combination of the push-button switches which are depressed at the same time. Although in the change of the embodiment, the switch section is composed of the two transistors, the switch section can also be composed of one transistor, and the number of the resistors composing the first resistance voltage-dividing circuit and the second resistance voltage-dividing circuit can also be suitably changed. The first voltage detecting circuit, the second voltage detecting circuit and the switch section can be composed of so-called discrete components, or for example, can be composed of one integrated circuit.

The present disclosure contains subject matter related to that disclosed in Japanese Priority Patent Application JP 2010-122818 filed in the Japan Patent Office on May 28, 2010, and Japanese Priority Patent Application JP 2011-053659 filed in the Japan Patent Office on Mar. 11, 2011, the entire contents of which are hereby incorporated by reference.

It should be understood by those skilled in the art that various modifications, combinations, sub-combinations and alternations may occur depending on design requirements and other factors insofar as they are within the scope of the appended claims or the equivalent thereof.

What is claimed is:

1. Solar power-generating equipment, comprising:
   a solar cell;
   a secondary battery;
   an electric power outputting portion;
   a display portion configured to display thereon information about an electric-generating capacity of said solar cell and information about a state of charge of said secondary battery; and
   a control portion configured to cause said display portion to display thereon the information about the electric-generating capacity of said solar cell for a predetermined time length, and cause said display portion to display thereon the information about the state of charge of said secondary battery for a predetermined length of time,
   wherein said display portion comprises a plurality of light emitting diodes, and
   wherein an emission color of light emitting diodes included in said display portion for displaying thereon the information about an electric-generating capacity of said solar cell and an emission color of light emitting diodes included in said display portion for displaying thereon the information about the state of charge of said secondary battery are different from each other.

2. The solar power-generating equipment according to claim 1, wherein:
   said control portion includes an electric-generating capacity display starting section; and
   by an operation of said electric-generating capacity display starting section, said control portion displays information about the electric-generating capacity on said display portion for a predetermined length of time.

3. The solar power-generating equipment according to claim 2, wherein said electric-generating capacity display starting section comprises a push-button switch.

4. The solar power-generating equipment according to claim 1, wherein said control portion intermittently displays the information about the electric-generating capacity on said display portion for a predetermined length of time.

5. The solar power-generating equipment according to claim 1, wherein when the electric-generating capacity of said solar cell exceeds an amount of power consumption of said display portion, said control portion causes said display portion to display thereon the information about the electric-generating capacity of said solar cell for a predetermined length of time.

6. The solar power-generating equipment according to claim 1, wherein said control portion includes a state-of-charge display starting section, and by an operation of said state-of-charge display starting section, said control portion causes said display portion to display the information about the state of charge of said secondary battery for a predetermined length of time.

7. The solar power-generating equipment according to claim 6, wherein said state-of-charge display starting section comprises a push-button switch.

8. The solar power-generating equipment according to claim 1, wherein said display portion for displaying thereon the information about an electric-generating capacity of said solar cell and said display portion for displaying thereon the information about the state of charge of said secondary battery comprise common plural light emitting diodes.

9. The solar power-generating equipment according to claim 1, further comprising:
   an electric power output starting section configured to control output of the electric power from said electric power outputting portion to outside.

10. The solar power-generating equipment according to claim 9, wherein said electric power output starting section comprises a push-button switch.

11. The solar power-generating equipment according to claim 9, wherein said electric power output starting section serves as an electric power output pausing section to pause the output of the electric power from said electric power outputting portion to the outside.

12. The solar power-generating equipment according to claim 11, wherein said electric power output starting section comprises a push-button switch.

13. The solar power-generating equipment according to claim 1, wherein said electric power outputting portion comprises a universal serial bus.

14. The solar power-generating equipment according to claim 1, further comprising:
   a second universal serial bus terminal through which charge is carried out from the outside to said secondary battery.

15. The solar power-generating equipment according to claim 1, further comprising:
   a secondary battery protecting circuit connected in parallel with said secondary battery.

16. The solar power-generating equipment according to claim 15, wherein
   said secondary battery protecting circuit includes a first voltage detecting circuit, a second voltage detecting circuit, a switch section, and a heat radiating section;
   said first voltage detecting circuit connected in parallel with said secondary battery has a temperature detecting section; and
   when one of or both of said second voltage detecting circuit and said first voltage detecting circuit connected in parallel with said secondary battery are held in an ON state, said switch section becomes a conduction state and the electric power accumulated in said secondary battery is transformed into heat by said heat radiating section.

* * * * *